United States Patent
Bolouri-Saransar

(10) Patent No.: US 12,416,651 B2
(45) Date of Patent: Sep. 16, 2025

(54) ABSENCE OF VOLTAGE DETECTOR

(71) Applicant: Panduit Corp., Tinley Park, IL (US)

(72) Inventor: Masud Bolouri-Saransar, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 18/669,722

(22) Filed: May 21, 2024

(65) Prior Publication Data

US 2024/0302414 A1    Sep. 12, 2024

Related U.S. Application Data

(63) Continuation of application No. 17/517,041, filed on Nov. 2, 2021, now Pat. No. 11,988,693, which is a continuation of application No. 16/480,346, filed as application No. PCT/US2018/017391 on Feb. 8, 2018, now Pat. No. 11,162,983.

(60) Provisional application No. 62/457,213, filed on Feb. 10, 2017.

(51) Int. Cl.
| | |
|---|---|
| G01R 31/28 | (2006.01) |
| G01R 15/16 | (2006.01) |
| G01R 19/00 | (2006.01) |
| G01R 19/155 | (2006.01) |
| G01R 19/18 | (2006.01) |

(52) U.S. Cl.
CPC .......... *G01R 19/155* (2013.01); *G01R 15/16* (2013.01); *G01R 19/0084* (2013.01); *G01R 19/18* (2013.01); *G01R 31/2829* (2013.01)

(58) Field of Classification Search
CPC ...... G01R 15/12; G01R 15/144; G01R 19/00; G01R 19/30; G01R 21/06; G01R 31/261; G01R 31/2623
See application file for complete search history.

(56) References Cited

U.S. PATENT DOCUMENTS

| | | | |
|---|---|---|---|
| 3,896,389 A | 7/1975 | Basse | |
| 5,564,100 A * | 10/1996 | Huang | H03C 3/222 |
| | | | 331/177 V |
| 6,885,184 B1 | 4/2005 | Gofman | |
| 2007/0100567 A1 | 5/2007 | Aggarwal et al. | |
| 2007/0108992 A1 | 5/2007 | Yanagisawa | |
| 2009/0061801 A1 | 3/2009 | Kobayashi | |
| 2013/0278576 A1 | 10/2013 | Lee et al. | |
| 2014/0300374 A1 | 10/2014 | McKenzie et al. | |

FOREIGN PATENT DOCUMENTS

| | | |
|---|---|---|
| JP | 2015230214 A | 12/2015 |
| KR | 102224523 B1 * | 3/2021 |
| WO | 2016048954 A1 | 3/2016 |

OTHER PUBLICATIONS

A system for the verification of the absence of voltage.*

* cited by examiner

*Primary Examiner* — Tung X Nguyen
(74) *Attorney, Agent, or Firm* — Christopher K. Marlow; Christopher S. Clancy; James H. Williams

(57) ABSTRACT

An absence of voltage indicator has an isolation circuit, an FM modulator attached to the isolation circuit, a reference oscillator, and a mixer attached to the reference oscillator and the FM modulator, wherein the output of the mixer is the difference of the two signals. In one embodiment, the FM modulator includes a variable capacitor which varies in response to a voltage in parallel to a fixed capacitor and an inductor in parallel to the capacitors.

1 Claim, 16 Drawing Sheets

ABSENCE OF VOLTAGE DETECTOR

CROSS REFERENCE TO RELATED APPLICATIONS

This application is a continuation of U.S. patent application Ser. No. 17/517,041, filed Nov. 2, 2021, which issued as U.S. Pat. No. 11,988,693 on May 21, 2024; which is a continuation of U.S. patent application Ser. No. 16/480,346, filed on Jul. 24, 2019, which issued as U.S. Pat. No. 11,162,983 on Nov. 2, 2021; which claims priority to International Patent Application Serial No. PCT/2018/017391, filed Feb. 2, 2018, and U.S. Provisional Application No. 62/457,213, filed Feb. 10, 2017, the subject matter of which is hereby incorporated by reference in its entirety.

FIELD OF THE INVENTION

The present invention relates generally to voltage detection and more specifically to a detector for detecting and indicating the absence of voltage.

BACKGROUND OF THE INVENTION

Prior to performing work on electrical installation/equipment, workers are required to verify that the equipment is in an electrically safe state. Until proven otherwise, one must assume that the equipment is energized and take all necessary precautions, including utilizing appropriate personal protective equipment (PPE). One part of the verification of an electrically safe work condition involves a test for the absence of voltage. This test is performed by a trained and qualified electrician using an adequately rated voltage tester, usually a portable voltmeter or multimeter. The electrician first tests the meter on a known, energized source to ensure it is working properly. He/she then verifies that voltage is absent in the electrical equipment by metering phase-to-phase and phase-to-ground. Finally, the meter is retested on a known, energized source to ensure it is still functioning properly and was not damaged during the test. Although voltage verification is an NFPA 70E requirement and considered a best practice, the test itself still presents a hazard because workers are exposed to energized circuits and conductors when using the voltage tester during the live portions of the test.

A permanently installed device that can detect the presence of and verify the absence of primary (single- or multi-phase AC or DC) voltage and positively indicate the status of voltage in a particular electrical compartment would be useful for this type of application.

Safety Integrity Level (SIL) proposes risk reduction to an acceptable level. Safety Instrumented Systems must reduce the risk of flawed function to a tolerable level by ensuring that everything is working and performing as expected. Testing must include the verification of the entire system.

This invention describes a novel method to verify the absence of a voltage using frequency modulation technique and utilizing additional several novel concepts. Some of the techniques utilized to build high level of confidence in the functionality of the system are redundant paths to decision making structure; verification process that is substantiated by checking to ensure that tester can detect the minimum voltage level it intended to detect; and determination if the tester is connected to the power line and detecting malfunction/drift of the critical components in the system.

SUMMARY OF THE INVENTION

An absence of voltage indicator has an isolation circuit, an FM modulator attached to the isolation circuit, a reference oscillator, and a mixer attached to the reference oscillator and the FM modulator, wherein the output of the mixer is the difference of the two signals. In one embodiment, the FM modulator includes a variable capacitor which varies in response to a voltage in parallel to a fixed capacitor and an inductor in parallel to the capacitors.

DETAILED DESCRIPTION OF PREFERRED EMBODIMENTS

The Detection Method

Figure 1:
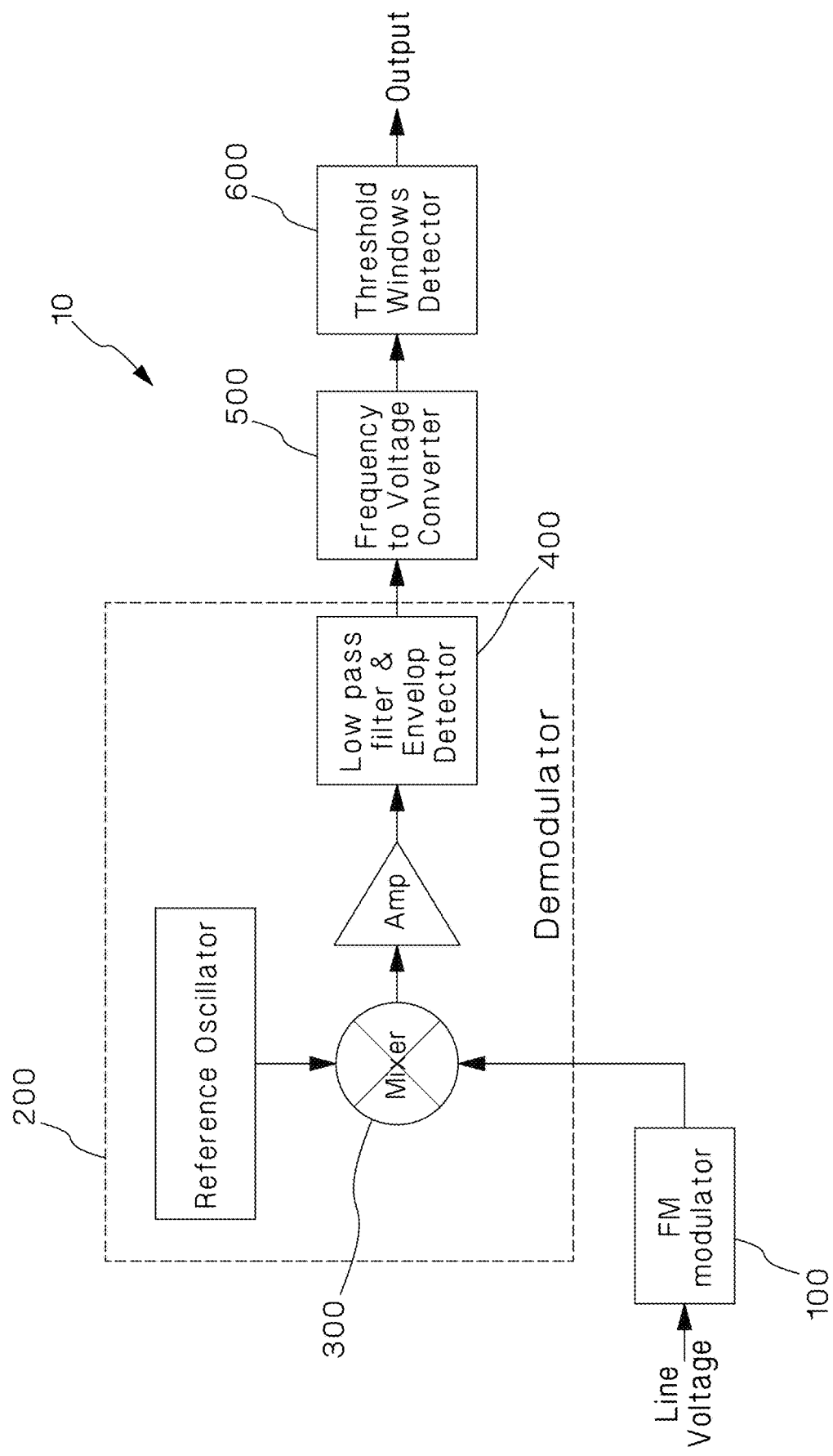
FIG. 1 is a system overview of one embodiment of a voltage indicator using frequency modulation.

The method utilizes an RF signal in which the frequency will vary depending upon the input voltage (FM modulated). To make the decision as to whether the line voltage exceeds the threshold value for presenting harmful voltage, the modulated signal is converted back to voltage level which is compared to a preset threshold value. The line voltage above this threshold of interest can be disregarded and the circuit is optimized around the threshold value. This is illustrated in the system overview of the absence of voltage indicator 10 in FIG. 1 which shows a FM modulator 100, reference oscillator 200, mixer 300, envelope detector 400, frequency to voltage convertor 500, and threshold windows detector 600.

At first glance, converting the voltage level to RF signal, then converting it back to voltage level appears redundant. However, as we progress through describing the concept it becomes clear that this method provides benefits and advantages in isolation, simplification of the system and satisfying the requirements of a system with high level of failsafe structure.

The FM Modulator

Figure 2:
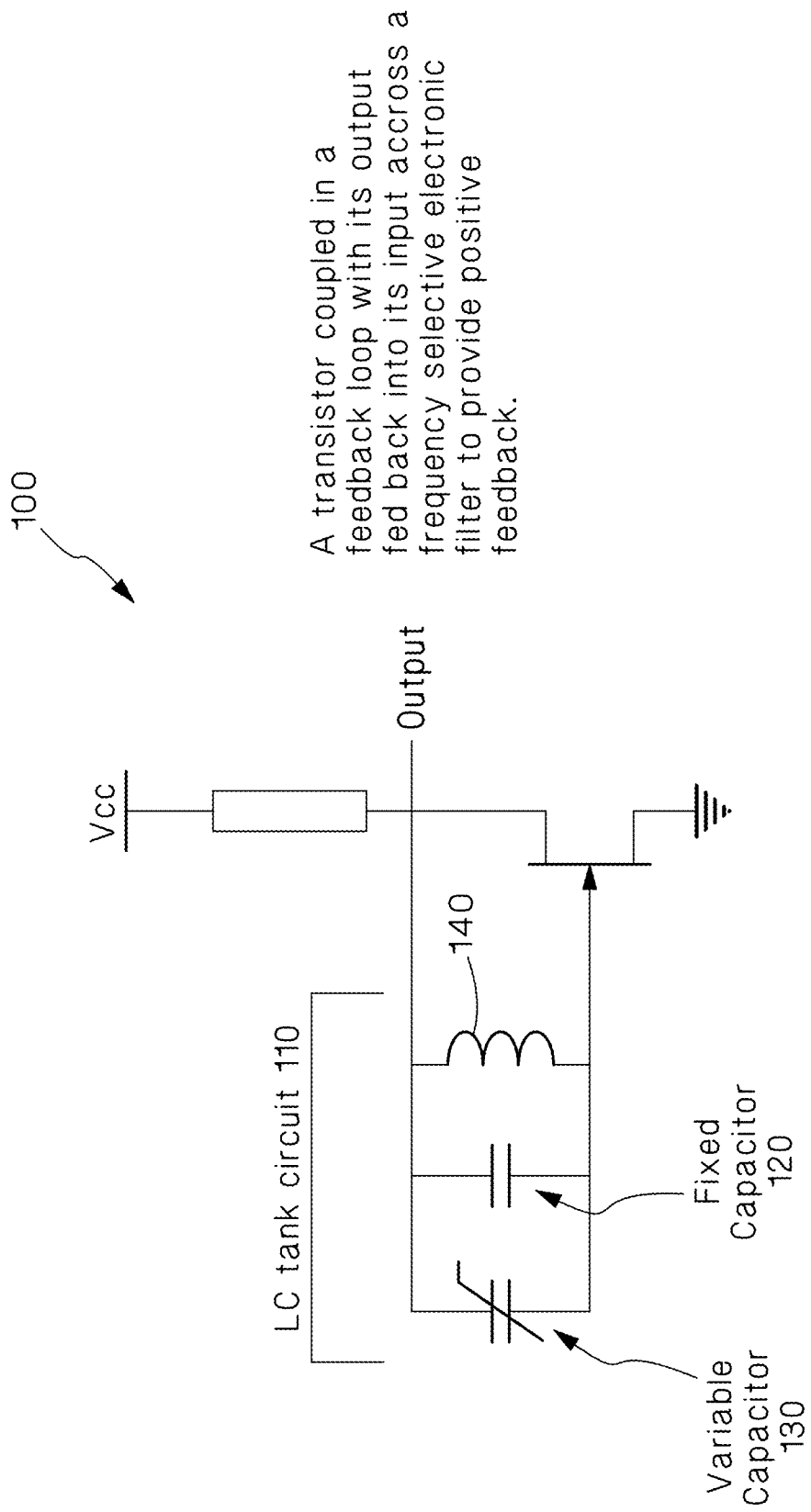
FIG. 2 is a schematic view of an LC tank circuit or FM modulator for the voltage indicator of FIG. 1.

As shown in FIG. 2, the FM Modulator 100 is based on an LC-tank oscillator circuit 110. The LC tank circuit 110 is a resonator consisting of an inductor 140 and a fixed capacitor 120 in parallel with a variable capacitor 130 (in one embodiment, varactors 135—see FIG. 3—can act as variable capacitors, varactor capacitance depends on the reverse voltage applied). Charge flows back and forth between the capacitors through the inductor, so the tuned circuit stores electrical energy oscillating at its resonant frequency. The frequency varies based on the capacitance which varies based upon the voltage applied across the varactors. The capacitor element of the LC tank consists of a fixed capacitor 120 to define the range and offset frequency of the oscillator and a variable capacitor 130 to provide the variable component of the modulator/oscillator. This setting is used to improve the failsafe condition, that will be discussed later part of the description of the concept.

Isolation Techniques

Figure 3:
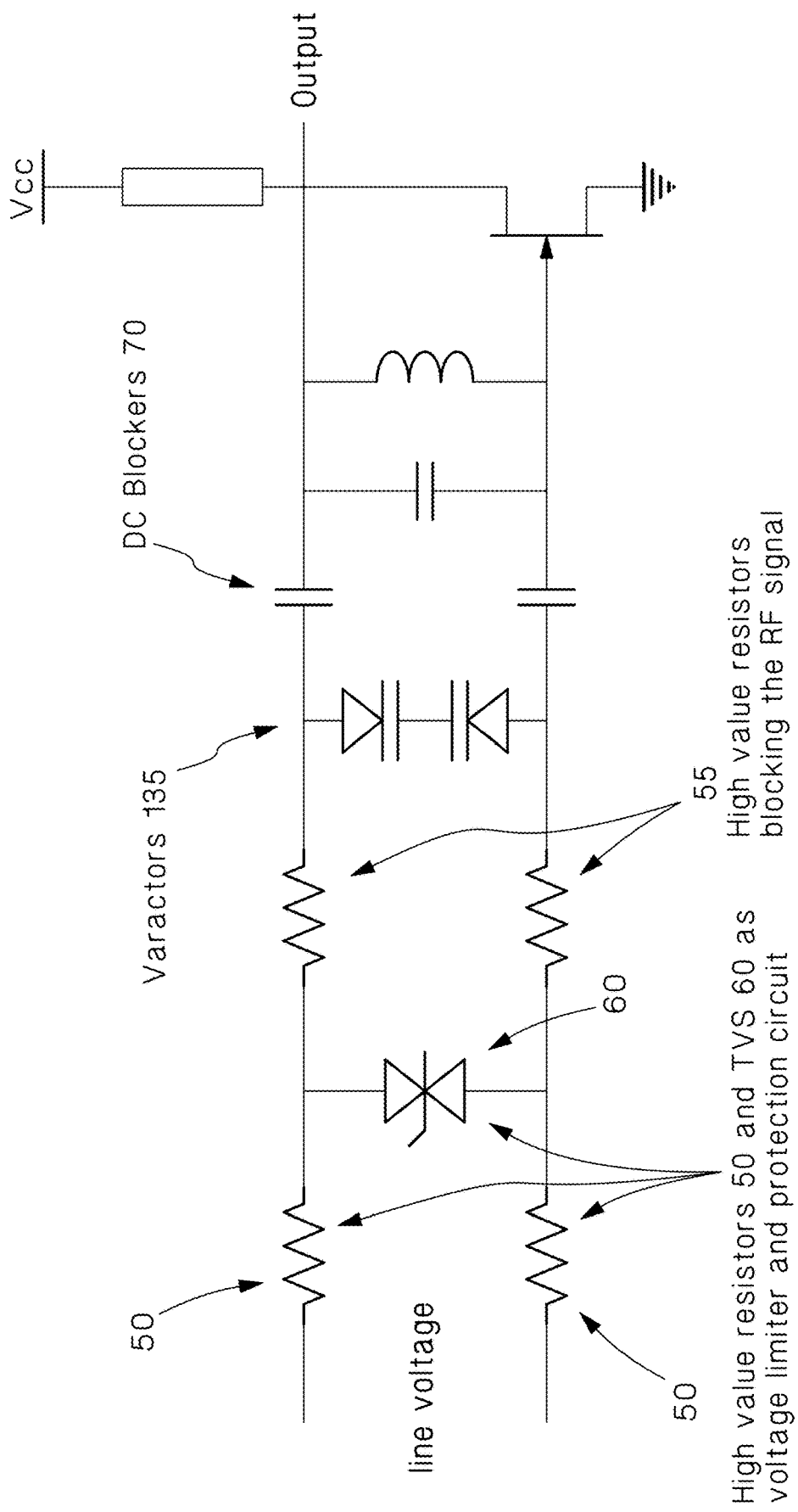
FIG. 3 is a schematic view of an isolation circuit used for the voltage indicator of FIG. 1.

To prevent damage of the detection circuitry caused by high voltage surges, ESD or transients on line voltage, an isolation circuit 40 is used as shown in FIG. 3. A first set of high value resistors 50 in combination with TVS diodes 60 are used. To eliminate the effect of the line voltage on the oscillator circuit, a set of DC blockers 70 (high value capacitors—relative to the fixed capacitor 120 and the variable capacitor 130 in the LC tank circuit 110) are used to block the DC and low frequency AC voltages while allowing the RF signal through. To eliminate the effect of these DC blocking capacitors, the capacitance value needs to be an order of magnitude higher value than the capacitance of the LC tank circuit 110. A second set of high value resistors 55 are used to block the RF signal from penetrating into rest of circuit and to prevent the TVS's capacitance affecting the oscillator frequency. Using two varactors 135 in series as a variable capacitor generates the same frequency variation for positive and negative voltages presented by the line voltage. This concept is illustrated in FIG. 3.

Demodulator—Reference Oscillator

Figure 4:
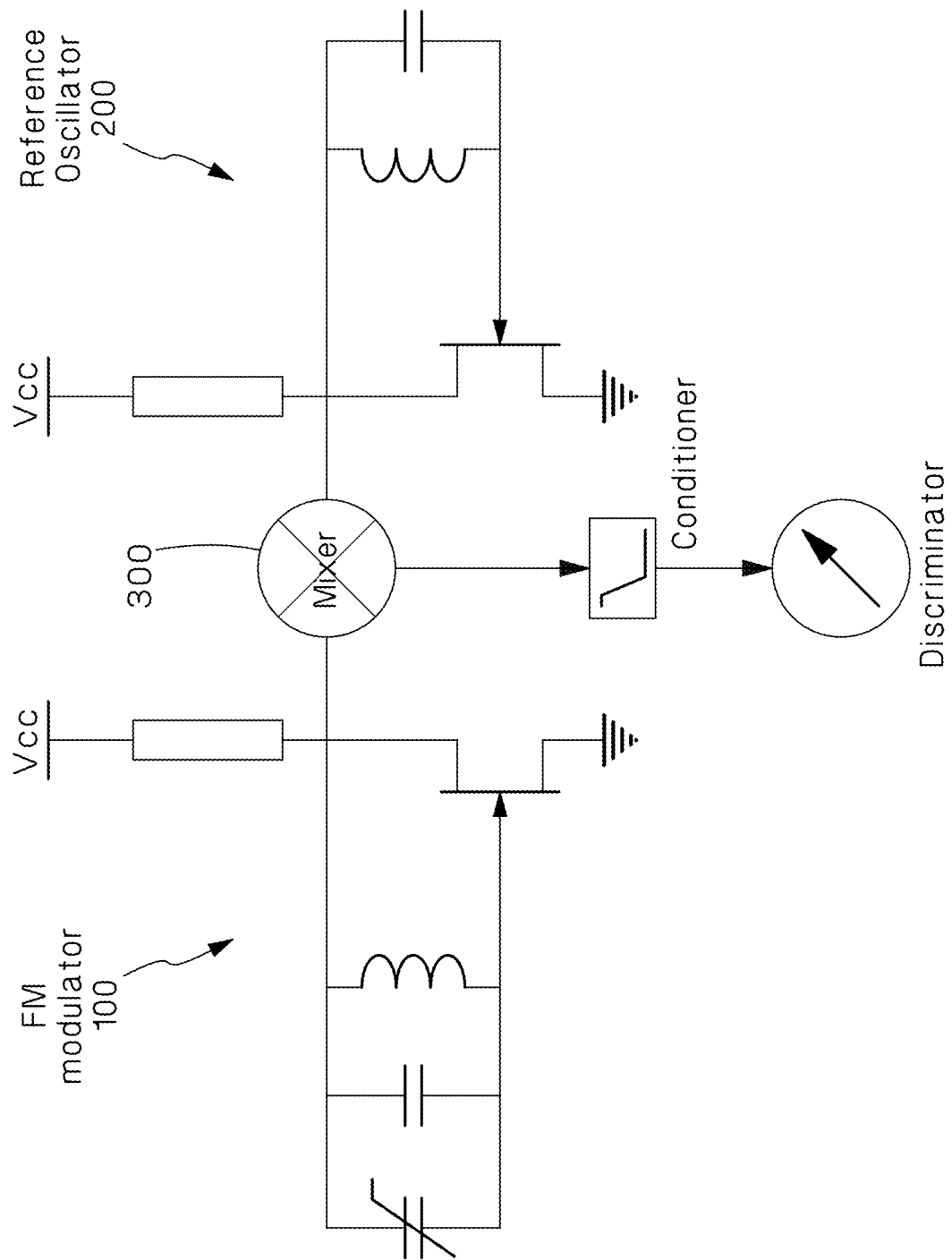
FIG. 4 is a schematic view of the FM modulator, reference oscillator, and mixer for the voltage indictor of FIG. 1.

As shown in FIG. 4, the output of the mixer 300 is the difference between the FM modulator 100 and the reference oscillator 200. The reference oscillator 200 is constructed using the same concepts as the FM modulator 100 but removes the variable capacitor. This approach reduces the inaccuracies based on supply voltage changes or component value drift due to temperature or other environmental changes. These changes affect the oscillators in same way and result in a reduced effect on the mixer output signal.

Demodulator—Mixer and Envelop Detector

Demodulation is realized by mixing the reference oscillator 200 signal and the FM modulator circuit 100. An envelope detector 400 is used to produce the difference of these input signals which is then converted to a square wave signal.

Figure 5:
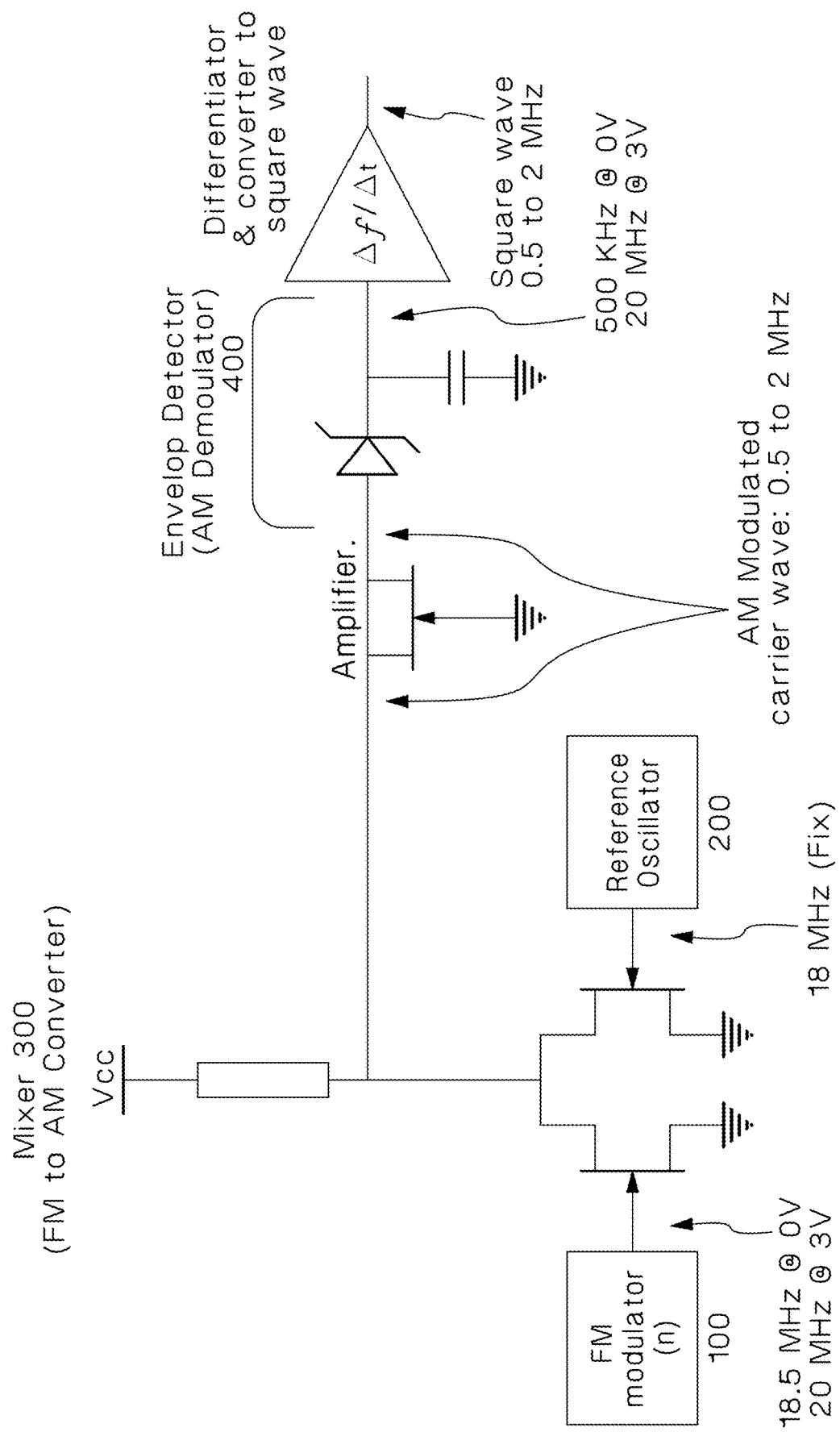
FIG. 5 is schematic view showing of FM modulator, reference oscillator, mixer, envelope detector, and differentiator.

As shown in FIG. 5, the FM modulator signal is always higher in frequency than the reference oscillator signal so the output signal frequency will be with a range say from 0.5 to 2 MHz.

Figure 6:
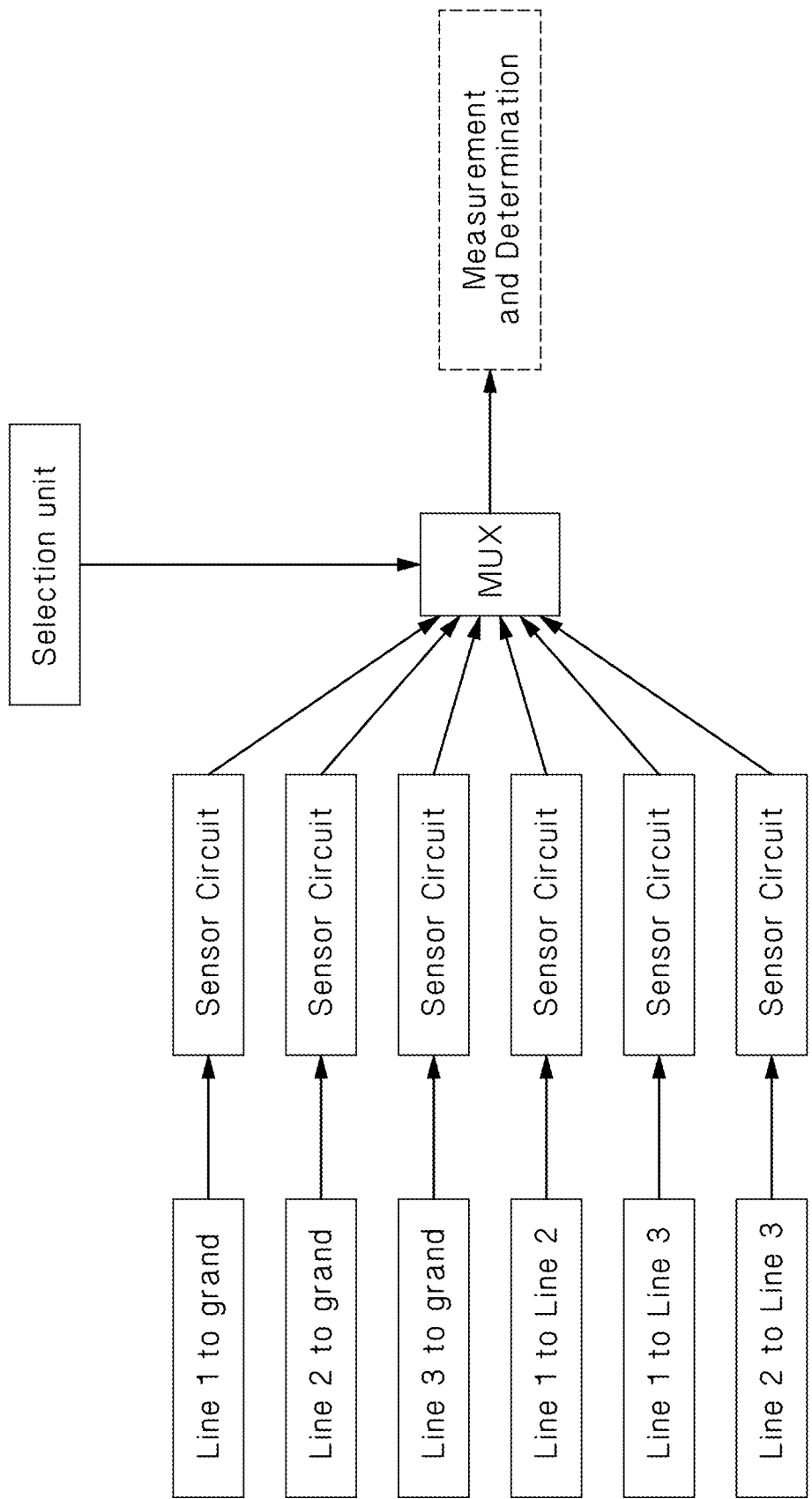
FIG. 6 is a system view showing the use of a multiplexor for taking various measurements.

Combining the Potential of Presence of Voltage in all, Line to Line and Line to Ground Arrangement To establish an absence of voltage scenario, every combination of 3 phase line to line and line to ground combinations are tested. As illustrated in FIG. 6, six FM modulator sensor circuit circuits are used to cover all potential combinations of presence of voltage. The FM modulators are selected one at a time for measurement and determination. The selection circuit is a circulating counter/state-machine that controls the multiplexor (MUX) to a pass one sensor circuit signal through at a time.

Figure 7:
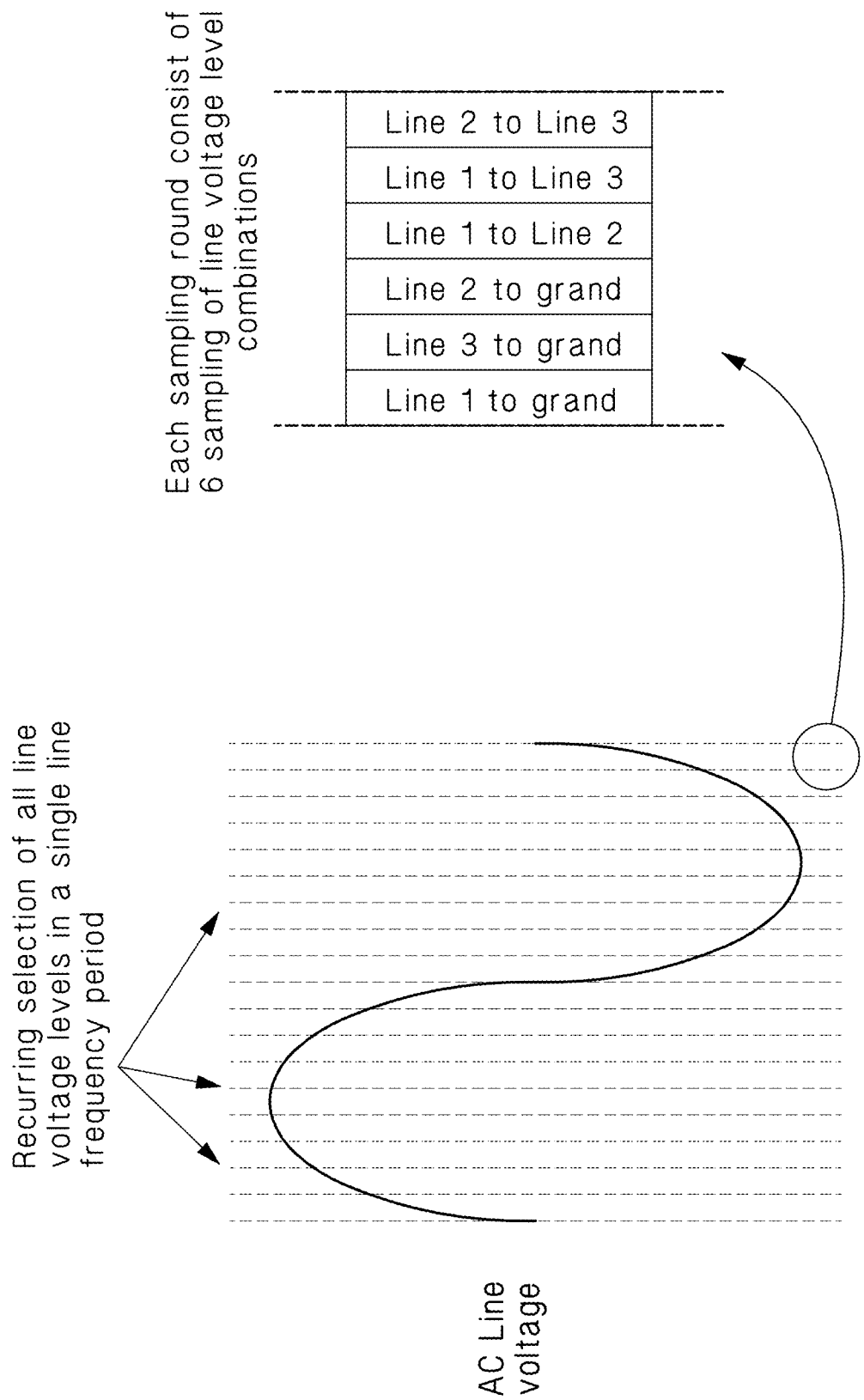
FIG. 7 shows the sampling rates of the circuit.

The circuit detects DC as well as AC 50/60 Hz line-voltage. To be assured that a voltage over the threshold is detected, oversampling of the line-voltage over period of 60 Hz is required. As shown in in FIG. 7, the selection circuit circulates the selection of sensor circuits multiple times over a period of a 60 Hz time periods.

The Detection System

Figure 8:
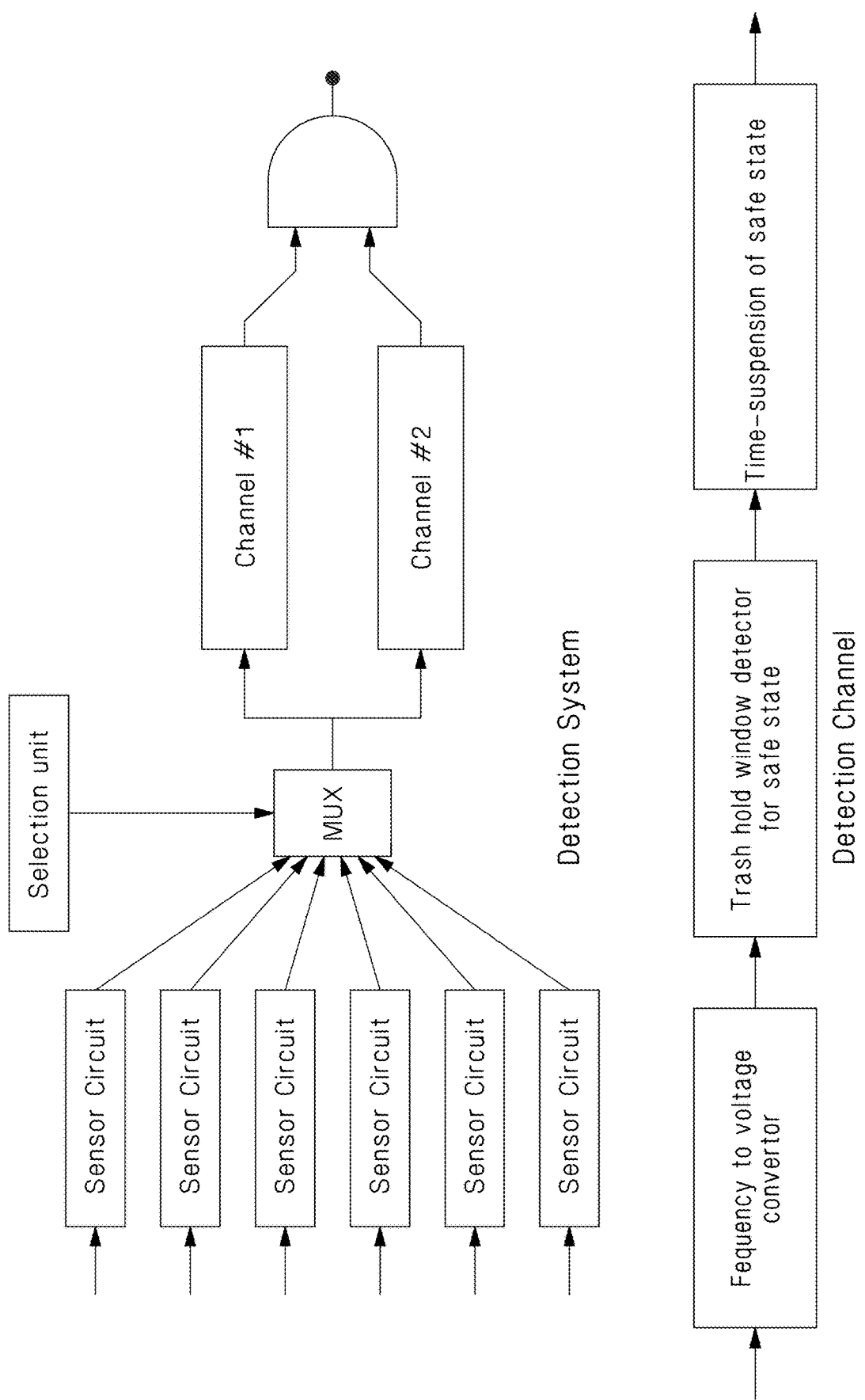
FIG. 8 is a system overview showing the use of redundant channels.

As shown in in FIG. 8, the detection system consists of two redundant channels. Each channel consists of a frequency to voltage convertor, a threshold window detector, and a time-suspension unit.

Figure 9:
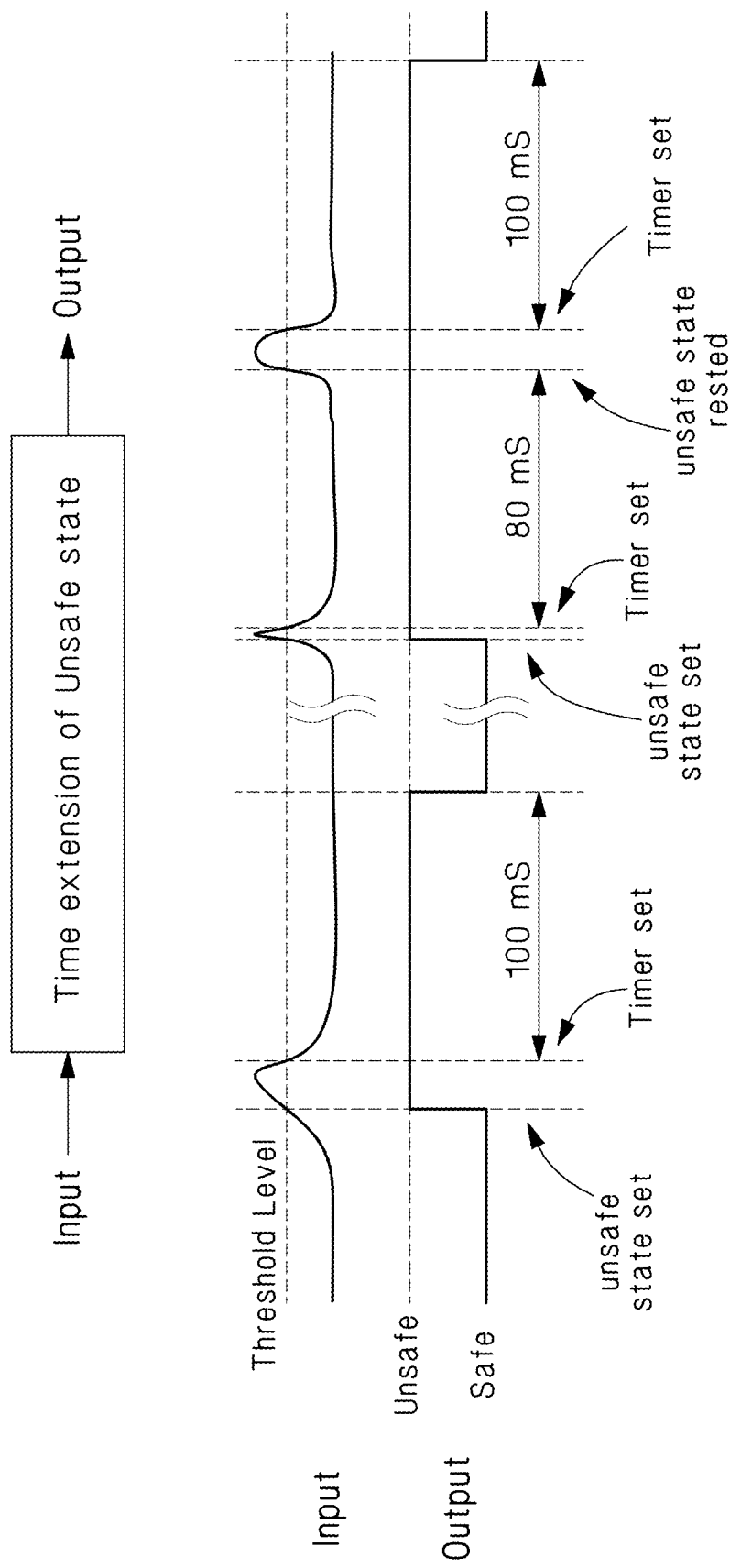
FIG. 9 illustrates the function of the time-suspension of safe-state.

The last stage in the detection channel is suspension of the safe state, or postponement of a safe-state indication, to establish that no threshold exit of line-voltage has occurred in last several periods of AC line voltage. FIG. 9 illustrates the function of the time-suspension of safe-state. 100 mS is used as example for the postponement of safe stage. As is shown in the figure, any new occurrence of threshold exit within the 100 mS will renew the timing of postponement.

Figure 10:
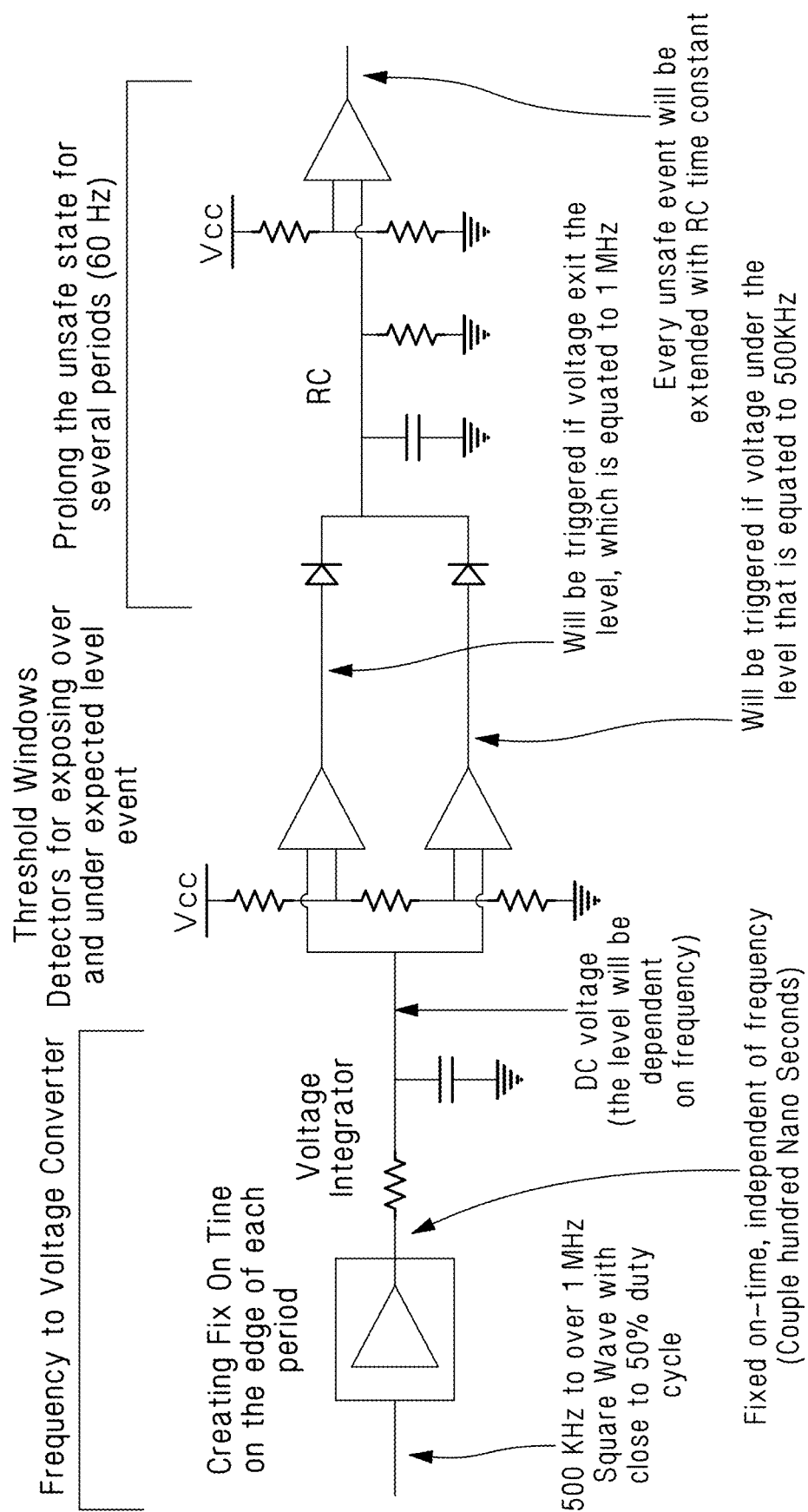
FIG. 10 illustrates an example for the implementation of the detection channel.

FIG. 10 illustrates an example for the implementation of the detection channel.

Preventing False-Safe Indication Due to Circuit/Component Failure/Drift

Figure 11:
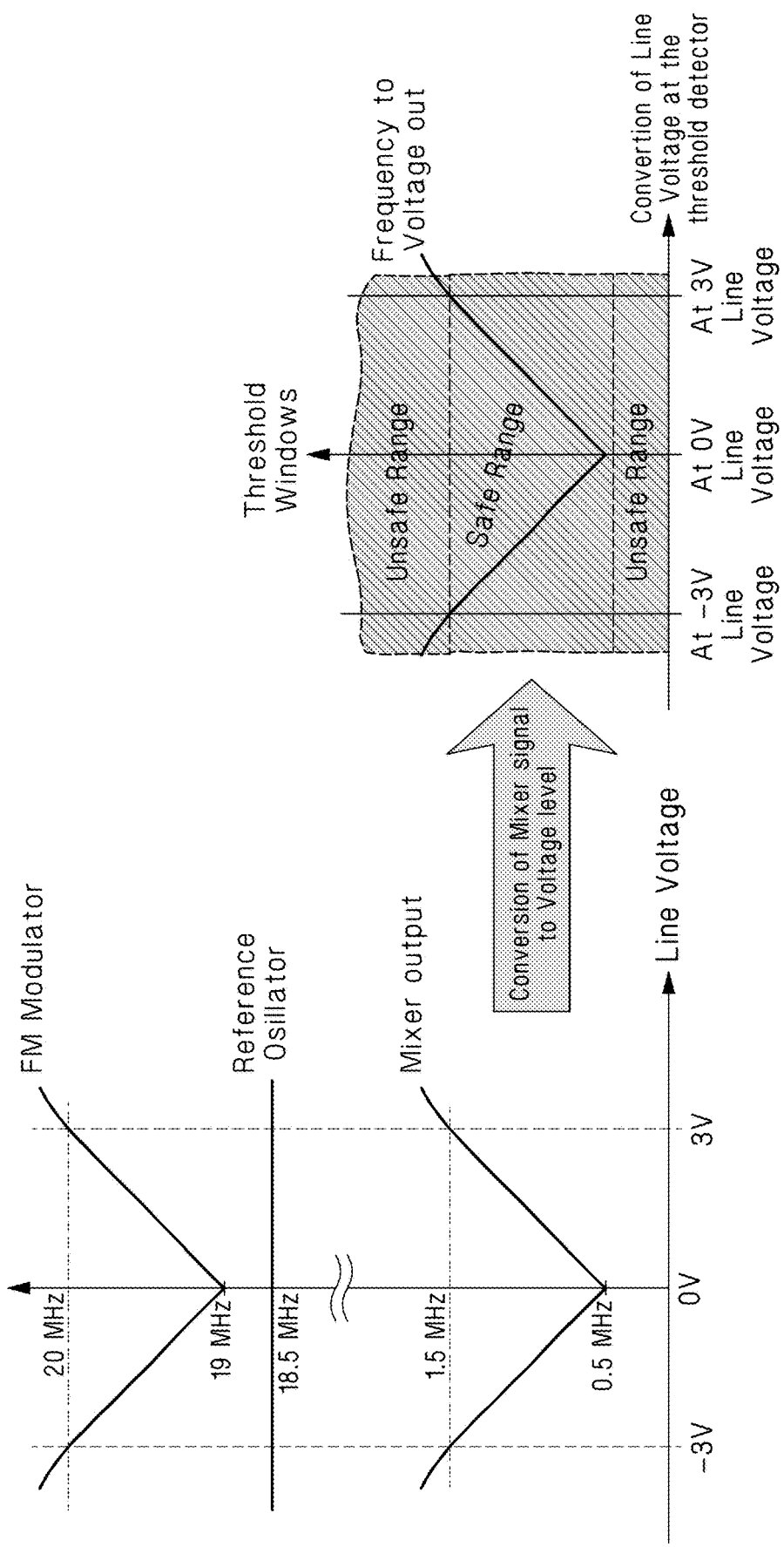
FIG. 11 illustrates the frequency output relative to voltage for the FM modulator, reference oscillator and mixer output.

As shown in FIG. 11, the FM modulator is generating about 19 MHz at a line voltage of 0 and about 20 MHz at 3 volts. This results in frequency around 0.5 MHz at 0 volts and around 1.5 MHz at 3 volts at the mixer output. When the frequency signal is converted to a voltage level it needs to result in a level within a certain safe voltage window. In the case of absence signal from any FM modulator or reference oscillator because failure of circuits/components, the mixer output frequency will move to a much higher frequency that will push the voltage level to the unsafe area at the Threshold Window detector circuit. This will result in a fail-safe scenario.

Figure 12:
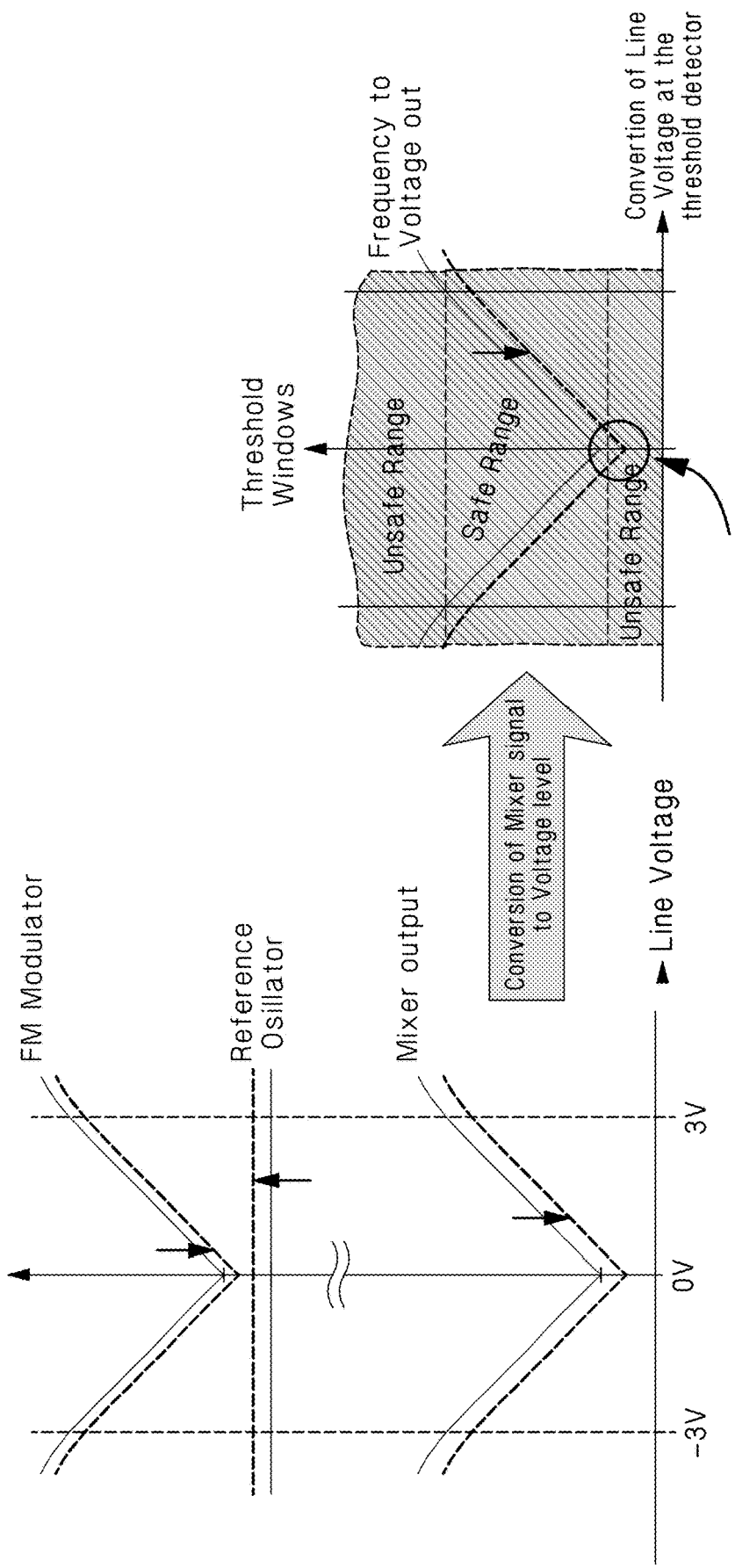
FIGS. 12 and 13 illustrates the fail-safe mechanism due to drift in frequency.

Any drift in component that results in a drift of FM modulator to a lower frequency range or the Reference Oscillator to higher frequency range will result in lower frequency at 0 Volt line-voltage scenario and will push the voltage level to unsafe area at the Threshold Window detector circuit. This also results in a fail-safe scenario. This is illustrated in FIG. 12.

Figure 13:
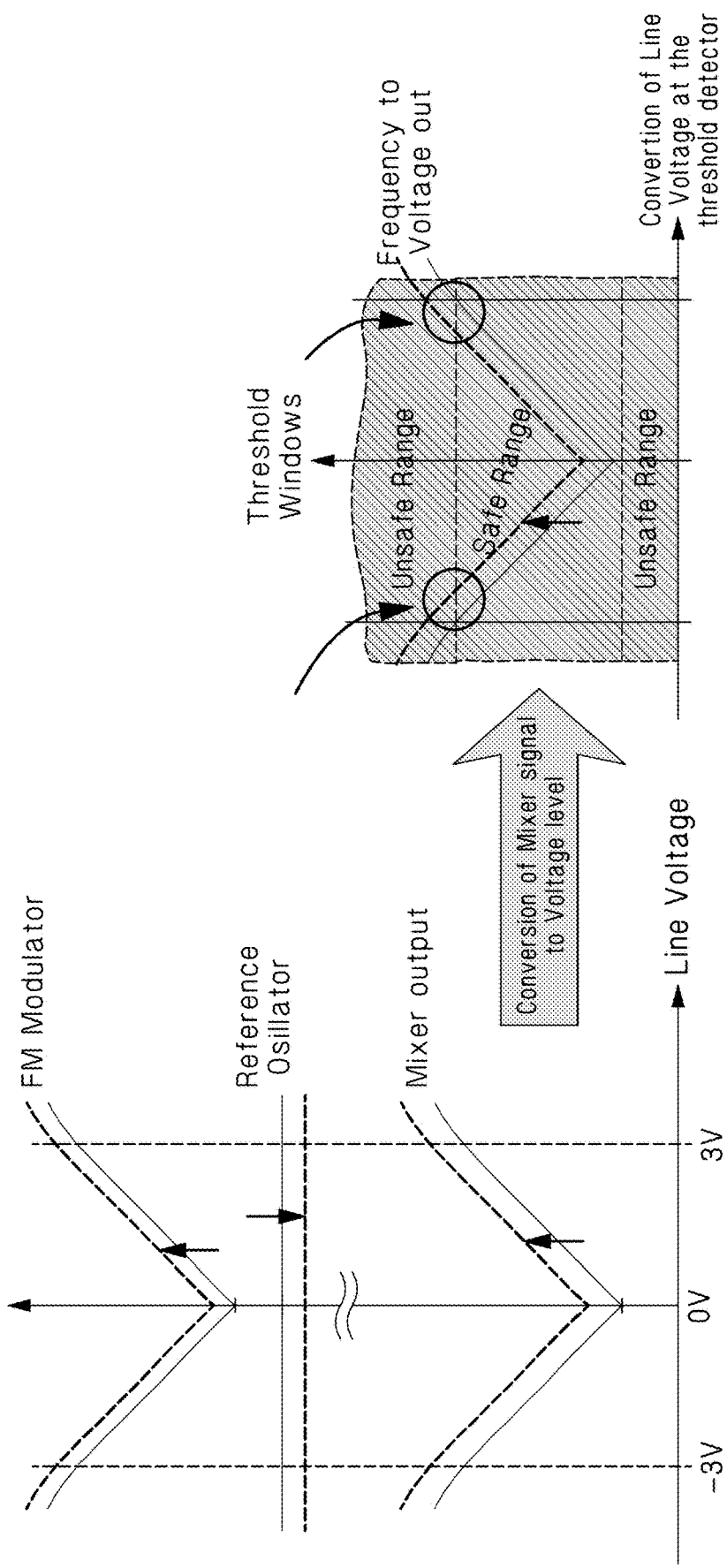

Any drift in component that results in a drift of FM modulator to a higher frequency range or Reference Oscillator to lower frequency range will result in lower frequency at around 3 Volt line-voltage scenarios and will push the voltage level to unsafe area at the Threshold Window detector circuit before it reaches 3 Volt. This will also result in a fail-safe scenario. This is illustrated in FIG. 13.

Validation of Tester's Functionality Utilizing Diagnostic Circuit

Figure 14:
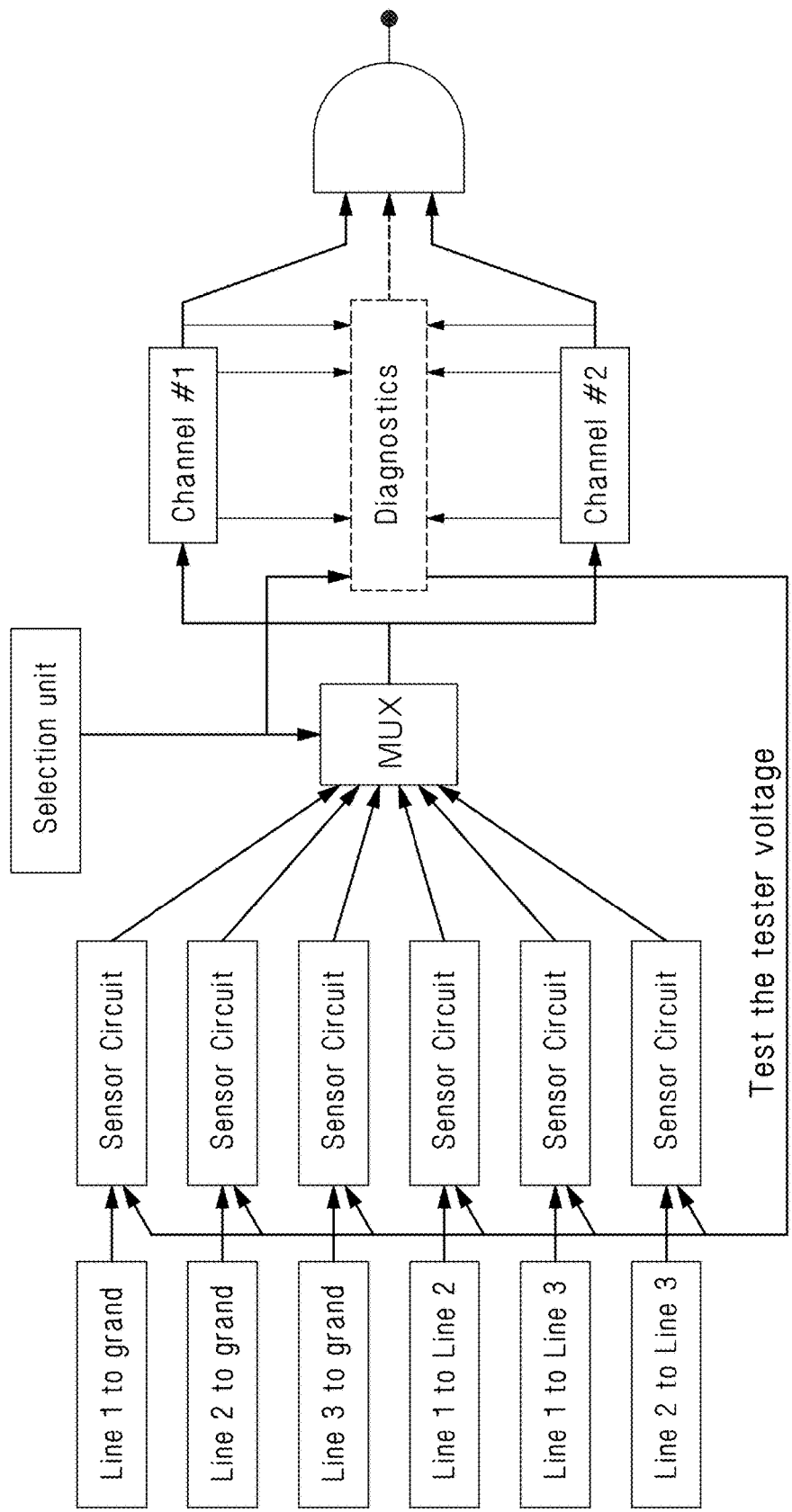
FIG. 14 is a system overview showing the use of a diagnostic system.

To establish a high level of confidence in the detection system, after an absence of voltage detection and before a safe state indication the detection circuit's functionality needs to be confirmed. This is called 'test the tester' and it is a part of the diagnostic system. As is illustrated by FIG. 14, the diagnostic unit is constructed utilizing a microcontroller and supporting components that has access to the Selection unit's signal/state, different stages in the Detection channels and the Sensor Circuits. It generates different voltage levels to the sensor circuits in specific time windows and monitors the Detection channels for the anticipated signals at the Detection channels. When a fault occurs in the system will be identified by the Diagnostics circuit.

Figure 15:
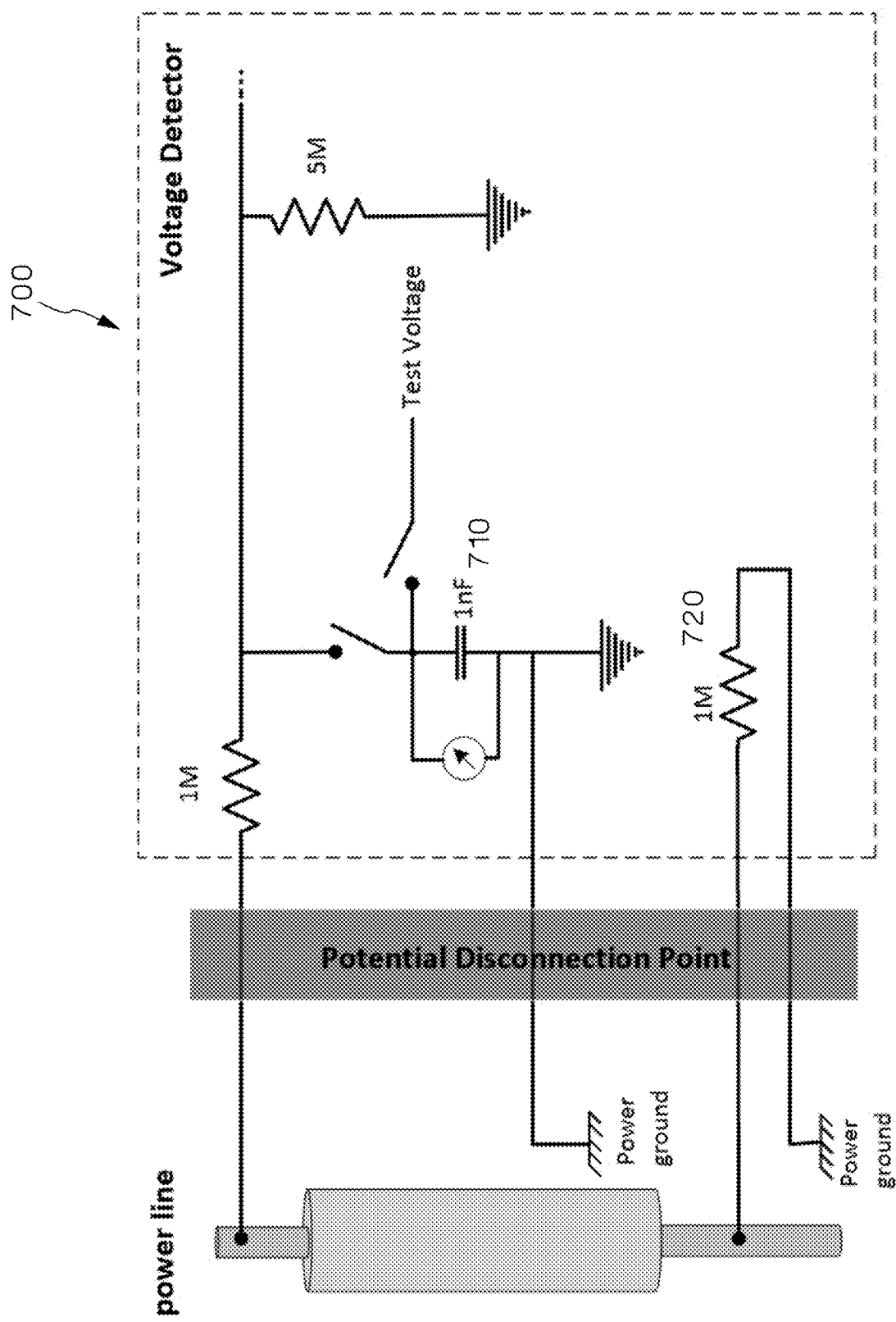
FIG. 15 is a schematic view of connectivity test for the voltage indicator of FIG. 1.
Figure 16:
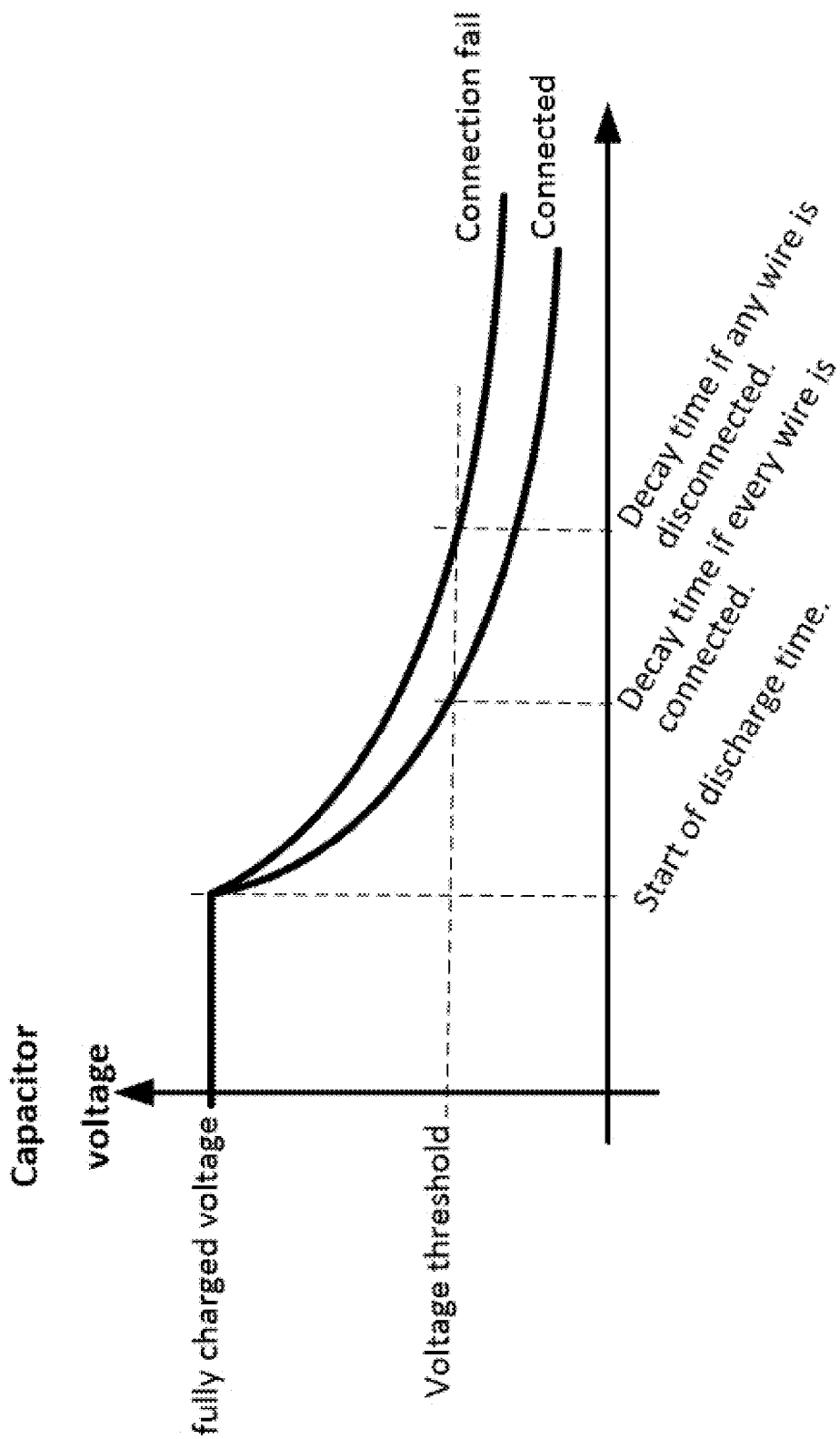
FIG. 16 is a graph showing the different discharge rates of the connectivity test when the indicator is connected and not connected.

Validation of the Voltage Detector's Connectivity to the Power Line and Ground Utilizing Diagnostic Circuit As a part of the diagnostic, connectivity of the tester to the line voltage and ground is verified. This is realized by technique illustrated in FIG. 15. FIG. 15 shows a connectivity tester 700 which has a capacitor 710 that is charged to a known voltage and then its discharge time measured. Due to a high a high value resistor 720 connected from the powerline to ground, the discharge time will defer depending on whether the voltage indicator is connected to the power line. As shown in FIG. 16, it utilizes a capacitor by charging it to a known voltage then discharging it through a set of resistors while measuring the decay time.

Any change in the overall resistance value will be exposed by change of the decay time. The power line is terminated to the ground through a high value resistor and absence of the resistor path/connection will change the decay time. This is illustrated in FIG. 16.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

The invention claimed is:

1. An isolation system for voltage detection circuitry comprising:
   a first circuit having a first high value resistance in series with a TVS diode in series with a second high value resistor
   a second circuit in parallel with the TVS diode having a third high value resistance in series with a varactor In series with a fourth high value resistance;
   a third circuit in parallel with the varactor having a first high value capacitance in series with the voltage detection circuitry in series with a second high value capacitance, and
   circuitry connected to the system capable of measuring a decay time and determining a state of connection based upon the decay time.

* * * * *